United States Patent
Nishida et al.

(10) Patent No.: US 6,881,922 B2
(45) Date of Patent: Apr. 19, 2005

(54) PLASMA GENERATING APPARATUS USING MICROWAVE

(75) Inventors: Yasushi Nishida, Tochigi (JP); Hiroaki Ito, Tochigi (JP); Noboru Yugami, Tochigi (JP)

(73) Assignee: Japan Science & Technology Corporation, Saitama (JP)

( * ) Notice: Subject to any disclaimer, the term of this patent is extended or adjusted under 35 U.S.C. 154(b) by 0 days.

(21) Appl. No.: 10/432,372

(22) PCT Filed: Nov. 21, 2001

(86) PCT No.: PCT/JP01/10178
§ 371 (c)(1),
(2), (4) Date: Nov. 5, 2003

(87) PCT Pub. No.: WO02/43452
PCT Pub. Date: May 30, 2002

(65) Prior Publication Data
US 2004/0070347 A1 Apr. 15, 2004

(30) Foreign Application Priority Data
Nov. 22, 2000 (JP) ........................................ 2000-356624

(51) Int. Cl.$^7$ ............................................. B23K 10/00
(52) U.S. Cl. ........................... 219/121.54; 219/121.43; 356/450; 156/345.44; 118/723 MW
(58) Field of Search .......................... 219/121.4, 121.41, 219/121.43, 121.54, 121.57; 356/450; 156/345.41, 345.44; 324/620, 76.79; 118/723 MW

(56) References Cited

U.S. PATENT DOCUMENTS

| | | | | |
|---|---|---|---|---|
| 3,875,399 A | * | 4/1975 | Teich | 398/163 |
| 5,187,672 A | * | 2/1993 | Chance et al. | 600/407 |
| 6,141,136 A | * | 10/2000 | Kalibjian | 359/260 |
| 6,240,305 B1 | * | 5/2001 | Tsuchiya | 600/310 |

FOREIGN PATENT DOCUMENTS

JP 09297178 A * 11/1997 ........... G01S/13/74

* cited by examiner

*Primary Examiner*—Mark Paschall
(74) *Attorney, Agent, or Firm*—Rader, Fishman & Grauer PLLC

(57) ABSTRACT

The present invention uses as a detector for adjustment measurement, monodyne interference between a microwave for plasma generation and the reflected wave. Analysis of the interference wave that is obtained using monodyne interference allows finding of the phase difference between the incident and the reflected wave and the amplitude of that reflected wave; and controlling of an excited microwave generation/control system based on them allows impedance matching between the excited microwave and the plasma. This method allows very high precision phase detection, and calculation of the characteristics of the plasma based on the detected phase shift. Therefore, it is possible to distinguish noises even in the vicinity of the matched region.

5 Claims, 3 Drawing Sheets

PLASMA GENERATING APPARATUS USING MICROWAVE

TECHNICAL FIELD

This invention relates to a plasma generating apparatus performing impedance matching control for plasma generated by a microwave and a to-be-applied microwave.

BACKGROUND ART

In the various manufacturing processes for electric devices, plasma generated by a microwave is used. In order to generate stabilized plasma, impedance-matching is necessary between a microwave source and plasma, which is a load. Since plasma is unstable as a load, normally it is necessary to control impedance.

In FIG. 1, plasma generated by a microwave is illustrated. Within this plasma generated by the microwave, there is a standing wave generated by an incident wave and corresponding reflected wave when impedance miss-matches. In plasma impedance-match measurement, conventionally, a standing wave in the above-mentioned plasma is directly measured using the Four-Point Prove Method where a probe is inserted in plasma. There are, however, the following problems:
(1) Plasma is unstable as a microwave circuit load;
(2) Since the reflected amount of the microwave from plasma is small, the corresponding detected level at around impedance-matched region becomes small, making it impossible to distinguish from noises (S/N ratio worsens); and
(3) Since the error derived from the poor processing precision and/or the assembly precision of each probe influences detection precision, etc., control precision for impedance matching worsens, making it difficult to provide stabilized plasma.

DISCLOSURE OF THE INVENTION

The objective of the invention is to perform high precision detection of an impedance matching level, thereby controlling a to-be-input microwave for plasma generation.

In order to achieve the above objective, this invention provides a plasma generator, which controls impedance matching between a microwave and plasma that occurs due to the said microwave and which is characterised by comprising: a microwave generator; an impedance adjustment unit, which changes the impedance for a microwave given by said microwave generator, a plasma generation unit, which receives the impedance adjusted microwave, generating plasma; a monodyne interference unit, which obtains an interference wave using the monodyne interference between the microwave given by the microwave generator and a microwave that has reflected by the plasma; and control unit, which processes a signal from the monodyne interference unit and provides a matching control signal; wherein impedane matching between the microwave and plasma is taken by giving the matching control signal from said control unit to said impedance adjustment unit and controlling that impedance.

The control unit provides the matching control signal by detecting the phase of the signal from the monodyne interference unit.

The monodyne interference unit comprises: a ninty degree coupler, which obtains the sine and the cosine components of the reflected microwave; two mixers, which mix said sine and said cosine components with the microwave from the microwave generator, respectively; and a low-pass filter, which removes the high frequency components of the mixed sine and the mixed cosine components.

The impedance adjustment unit performes impedance adjustments by selecting from plural stubs.

BEST MODE FOR CARRYING OUT THE INVENTION

Figure 1:
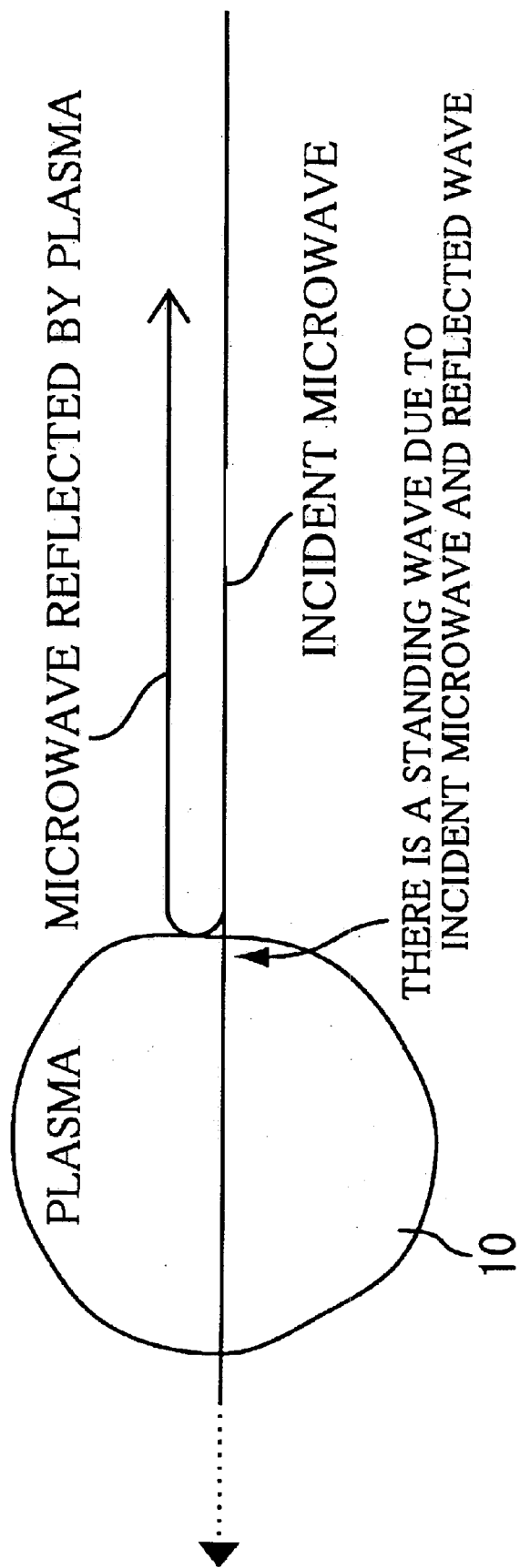
FIG. 1 is a drawing explaining the relationship between the plasma and the incident microwave.

Referring to the drawings, the following explains in detail an embodiment of the present invention.

Figure 2:
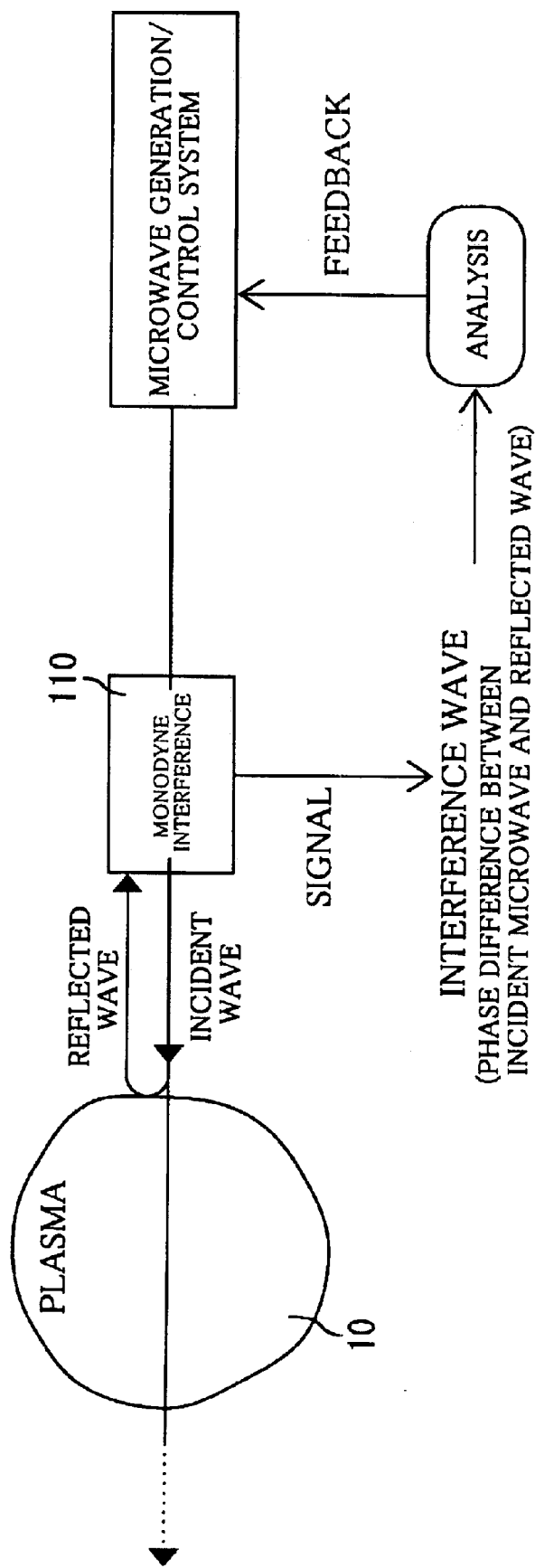
FIG. 2 is a drawing explaining a basic constitution of this invention.

FIG. 2 shows a configuration of the present invention. The present invention, as shown in FIG. 2, utilizes, as a matching level detector, the monodyne interference between a microwave for plasma generation and corresponding reflected wave. Through analysis of the interference wave resulting from that monodyne interference, the phase difference between the incident and the reflected wave, and the reflected wave amplitude can be calculated. Control of an exited microwave generation/control system in conformity with them allows impedance matching between the generating microwave and the plasma.

This method especially allows high precision and instantaneous phase detection, and calculation of the characteristics of the plasma based upon the changes of the detected phases; therefore, even in the vicinity of the matching region, it is possible to distinguish from noises. Since as the name monodyne shows, a plasma generatng microwave is used as a microwave that generates interferences, even if the frequency of microwave source fluctuates, the precision cannot deteriorate.

Figure 3:
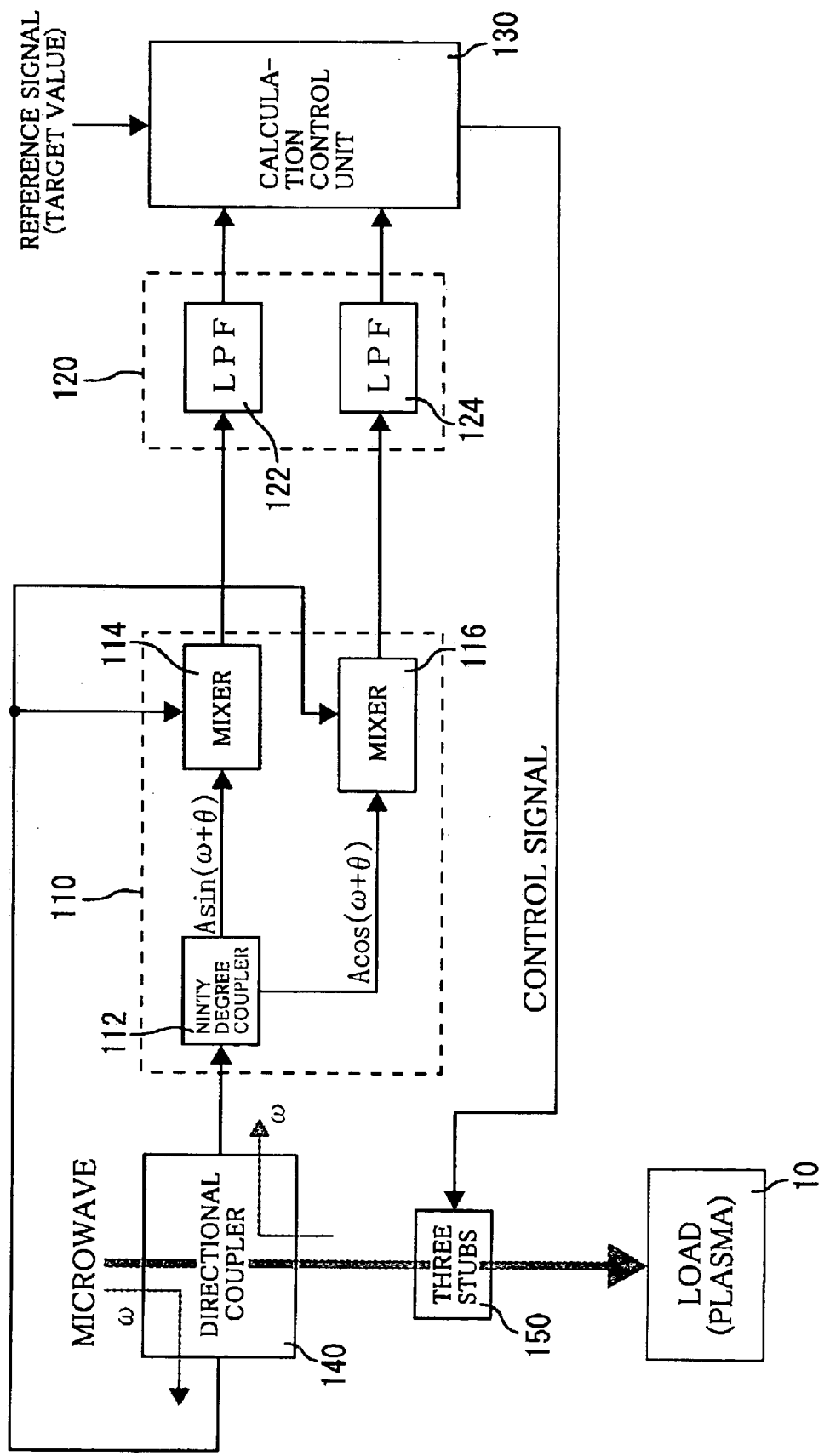
FIG. 3 is a drawing showing an embodiment of the present invention.

FIG. 3 is a block diagram showing an example of a specific control configuration. In FIG. 3, the signal from the microwave source (not shown in the drawing) is given to the plasma 10, which is a load, via a directional coupler 140 and three stubs for a maching condition adjustment 150. The signal reflected from plasma 10 comes via directional coupler 140 to a ninty degree hybrid 112, which then divides it into the sine and the cosine wave components. The reflected signal is mixed with the microwave source signal, which comes from the directional coupler 140, by mixers 114 and 116. From the mixed signal, low frequency components are extracted by a low-pass filters 122 and 124. A calculation control unit 130 compares with a predetermined reference signal, which is a target value, using the phase shift between the incident and the reflected wave that is calculated from the extracted low frequency components, as well as the amplitude of the reflected wave obtained at the same time, and then outputs a control signal that plays a role of satisfying impedance match conditions. By automatically operating three stubs for adjustment 150 in conformity with this control signal, impedance matching between the generating microwave and plasma 10 is taken.

As described above, the reason why the ninty degree coupler 112 extracts the microwave sine components and the cosine components whose phases differ ninty degrees therefrom, respectively, is because calculation by the calculation control unit 130 becomes easy, as explained next.

Regarding the output of the ninty degree coupler 112, the mixers 114 and 116 respectively output the following:

$A \sin(\omega+\theta) \times \sin \omega = -(A/2)\{\cos(2\omega+\theta) - \cos \theta\}$ $A \cos(\omega+\theta) \times \sin \omega = (A/2)\{\sin(2\omega+\theta) - \sin \theta\}$ The low-pass filters 122 and 124 remove $2\omega$ components from these output signals, respectively, providing a $(A/2) \cos \theta$ and a $(A/2) \sin \theta$ signal. The calculation control unit 130 squares these signals, respectively, and then adds them together, providing the amplitude of the reflected wave as shown below:

$((A/2)\cos \theta)^2 + ((A/2)\sin \theta)^2 = A^2/4$

It is possible to calculate an accurate phase $\theta$ from the $(A/2) \cos \theta$ signal or the $(A/2) \sin \theta$ signal using this amplitude.

By comparing this phase $\theta$ and the reference signal (target value) and selecting the stub configured with the transmission lines where, for example, one of three ends is short-circuited, it is possible to match the impedance between the plasma, which is a load, and the to-be-input microwave. The reason why that phase is used here is because a phase is detectable in the vicinity of the impedance-matched region where the reflected wave becomes feeble as long as an interference occurs. Therefore, high precision control at a high S/N ratio can be carried out. Furthermore, it is possible to detect the amplitude of the reflected wave and then control it.

Referencing the above-mentioned circuit, examples where real control for impedance matching for microwave is made are shown in the table below.

|  | Actual example 1 | Actual example 2 |
| --- | --- | --- |
| Frequency of microwave or the like | 2.45 GHz | 450 MHz |
| Power | 3 kW | 5 kW |
| Plasma | Ar | Ar |
| Matching point reflection coefficient | 0.3% or less | 0.5% or less |
| Required adjustment time | 2 sec. or less | 2 sec. or less |

In more greatly mismatching regions, while the Four-Point Prove Method can provide control within 2 sec., however, in the low reflectance regions for microwave (in the vicinity of the the matching region), this method cannot provide excellent control. As shown in the table, the monodyne interference method can provide control even in the latter region.

The above-mentioned calculation control unit 130 may be configured from a microcomputer by A/D converting the input signal to a digital signal.

INDUSTRIAL UTILIZATION

Even though a load such as plasma is unstable, the characteristics of the plasma can be measured using monodyne interference method while upmostly avoiding the influence of noises. Calculation processing of the obtained data using a computer or the like allows high presicion impedance matching. As a result, the plasma apparatus can be used for device manufacturing processes.

What is claimed is:

1. A plasma generator, which controls for impedance matching between a microwave and plasma that occurs due to the microwave, comprising:

a microwave generator;

an impedance adjustment unit, which changes the impedance for a microwave given from said microwave generator, a plasma generation unit, which receives the impedance adjusted microwave, generating plasma;

a monodyne interference unit, which obtains an interference wave due to the monodyne interference between the microwave given from said microwave generator and a microwave that has reflected by said plasma; and a control unit, which processes a signal from the monodyne interference unit and provides a matching control signal; wherein impedance matching between the microwave and plasma is taken by giving the matching control signal from said control unit to said impedance adjustment unit and controlling that impedance.

2. The plasma generator according to claim 1, wherein said control unit provides said matching control signal by detecting the phase of the signal from the monodyne interference unit.

3. The plasma generator according to either claim 1 or claim 2, wherein said monodyne interference unit comprises:

a ninty degree coupler, which obtains the sine and the cosine components of the reflected microwave;

two mixers, which mix said sine and said cosine components with the microwave from the microwave generator, respectively; and a low-pass filter, which removes the high frequency components of the mixed sine and the mixed cosine components.

4. The plasma generator according to any one of claim 1 or claim 2, wherein said impedance adjustment unit performs an impedance adjustment by selecting from plural stubs.

5. The plasma generator according to claim 3, wherein said impedance adjustment unit performs an impedance adjustment by selecting from plural stubs.

* * * * *